(12) United States Patent
Akahori

(10) Patent No.: US 6,889,239 B2
(45) Date of Patent: May 3, 2005

(54) DIGITAL FILTER AND DATA PROCESSING METHOD THEREOF

(75) Inventor: Hiroshi Akahori, Hamamatsu (JP)

(73) Assignee: Yokogawa Electric Corporation, Musashino (JP)

( * ) Notice: Subject to any disclaimer, the term of this patent is extended or adjusted under 35 U.S.C. 154(b) by 569 days.

(21) Appl. No.: 09/977,934

(22) Filed: Oct. 17, 2001

(65) Prior Publication Data

US 2002/0062328 A1 May 23, 2002

(30) Foreign Application Priority Data

Nov. 20, 2000 (JP) .......................... 2000-352944

(51) Int. Cl.[7] .................. G06F 17/17; G06F 17/10
(52) U.S. Cl. .................. 708/313; 708/319; 708/316
(58) Field of Search ................ 708/311, 313, 708/316, 319

(56) References Cited

U.S. PATENT DOCUMENTS

| | | | | |
|---|---|---|---|---|
| 4,660,216 A | * | 4/1987 | Claasen et al. | 708/319 |
| 5,050,119 A | * | 9/1991 | Lish | 708/319 |
| 6,032,171 A | * | 2/2000 | Kiriaki et al. | 708/319 |
| 6,035,312 A | * | 3/2000 | Hasegawa | 708/319 |
| 6,058,407 A | * | 5/2000 | Kim | 708/319 |
| 6,377,968 B1 | * | 4/2002 | Nakase et al. | 708/319 |

* cited by examiner

*Primary Examiner*—Tan V. Mai
(74) *Attorney, Agent, or Firm*—Oliff & Berridge PLC

(57) ABSTRACT

Data other than inserted "0"s are selected by first selectors from among a plurality of data included in input data to which zero value interpolation is carried out at an interpolation circuit. Besides, coefficients by which the data selected by the first selectors should be multiplied are selected by second selectors. The data selected by the first selectors are multiplied by the coefficients selected by second selectors in multiplication circuits. Then, an adding circuit adds all of the multiplied results and outputs the added result as the desired filter characteristic.

5 Claims, 4 Drawing Sheets

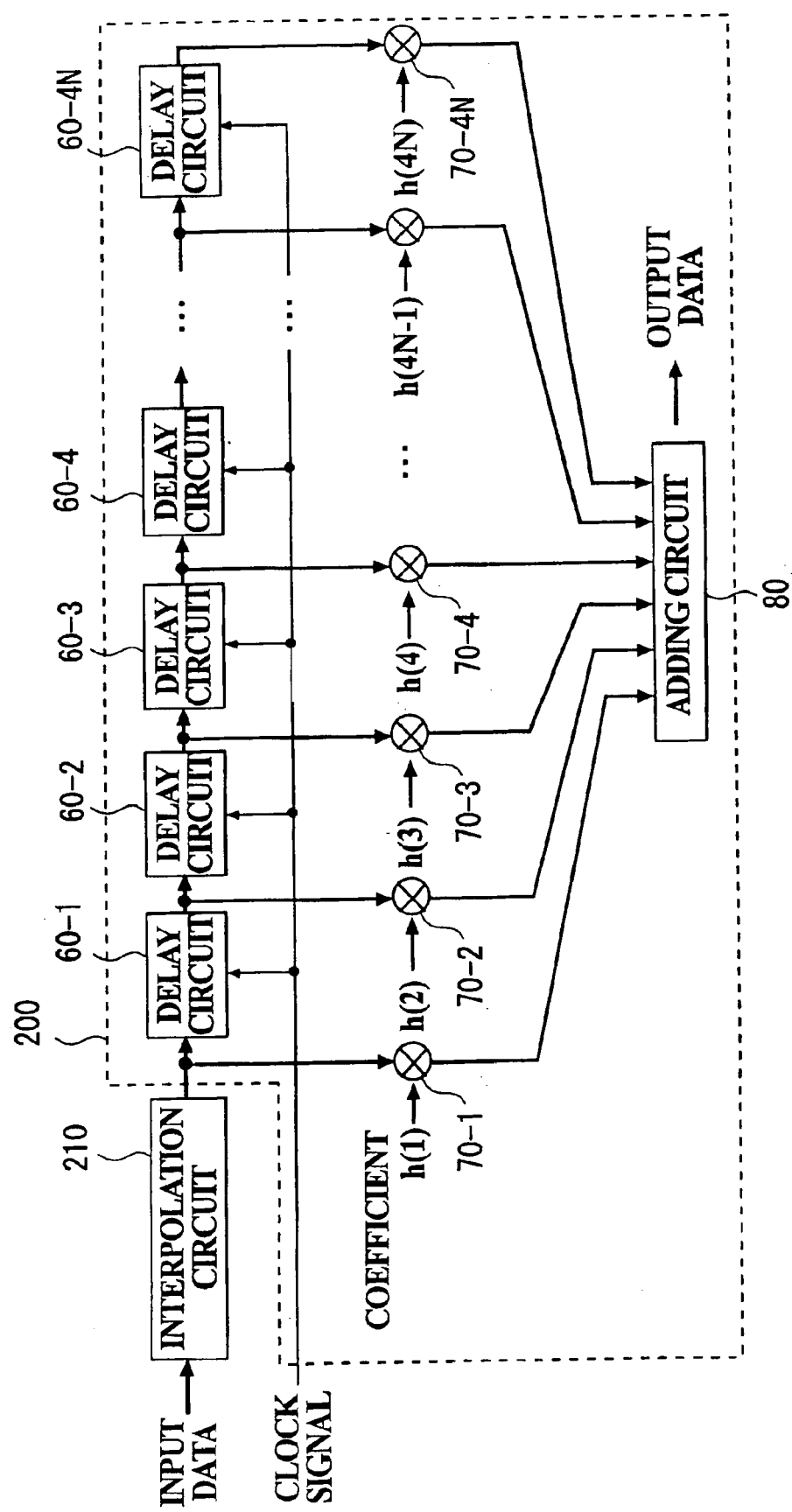
FIG.3 *(PRIOR ART)*

DIGITAL FILTER AND DATA PROCESSING METHOD THEREOF

BACKGROUND OF THE INVENTION

1. Field of the Invention

The present invention relates to a digital filter for filtering data to which oversampling is carried out, and a data processing method thereof.

2. Description of Related Art

As a digital filter, for example, an FIR (Finite Impulse Response) filter whose impulse response lasts for finite time, is known. The output of the FIR filter, that is, the filter characteristic, is obtained by weighting each output of the multistage registers in the FIR filter with a predetermined weighting coefficient, and by adding all of the weighted values. In order to obtain the desired filter characteristic, the weighting coefficient by which each output of the registers is multiplied is made to correspond to the impulse response of the desired filter characteristic. Further, oversampling may be carried out in order to decrease unnecessary signals caused by folding.

For example, FIG. 3 is a view showing a circuit configuration of an FIR filter 200 when fourfold oversampling and filtering are carried out to input data with data length of N. Further, the clock signal in FIG. 3 is a signal for taking synchronism of action of each circuit in the FIR filter 200.

At first, zero value interpolation to data length of 4N is carried out to the input data with data length of N in an interpolation circuit 210. Concretely, as shown in FIG. 4, interpolation is carried out to the input data by inserting three "0"s between each adjacent data in the input data with data length of N, in other words, three "0"s are inserted after each original data in the input data, so that data with data length of 4N is generated. Then, the data with data length of 4N is inputted into the FIR filter 200.

As shown in FIG. 3, the FIR filter 200 comprises 4N-stages of delay circuits 60-$n$ ($n$=1,2,3, . . . , 4N), multiplication circuits 70-$n$ which are the same number (4N) as the delay circuits 60-$n$, and an adding circuit 80.

The delay circuits 60-$n$ shift the inputted data for every timing of the clock signal which is inputted, and output the shifted data to the latter stage delay circuits 60-$n$. For example, the delay circuit 60-1 outputs the shifted data to the delay circuit 60-2, or the like. Further, the shifted data are outputted to the multiplication circuits 70-$n$ at the same time, in parallel. The multiplication circuits 70-$n$ multiplies the data inputted from the delay circuits 60-$n$ by the predetermined coefficients h($n$), respectively. Then, the multiplication circuits 70-$n$ output the multiplied results to the adding circuit 80.

Further, the adding circuit 80 adds all of the multiplied results inputted from the multiplication circuits 70-$n$, and outputs the added result. The added result from the adding circuit 80 becomes the output data (filter characteristic) of the FIR filter 200.

That is, the data to which zero value interpolation is carried out, and which is inputted into the FIR filter 200 are shifted for every timing of the clock signal, and each shifted data is multiplied by the predetermined coefficient h($n$). Then, the multiplied results are all added, so that the desired filter characteristic can be obtained.

FIGS. 4A and 4B show the relation between the input data and the output data (filter characteristic) outputted from the FIR filter 200. As shown in FIG. 4A, zero value interpolation to data length of 4N is carried out to the input data with data length of N by inserting three "0"s between each adjacent data of the input data with data length of N (that is, three "0"s are inserted after each original data), in the interpolation circuit 210, and the data with data length of 4N is inputted into the FIR filter 200. Then, each data in the data to which interpolation to data length of 4N is carried out is multiplied by the predetermined coefficient h($n$) in the multiplication circuits 70-$n$.

For example, as shown in FIG. 4A, the data D(N) is multiplied by the coefficient h(1), the three "0"s inserted between the data D(N) and data D(N−1) are multiplied by the coefficients h(2), h(3) and h(4), respectively, the data D(N−1) is multiplied by the coefficient h(5), or the like.

All of the multiplied results are added in the adding circuit 80, and the added result is outputted from the FIR filter 200. That is, the output data from the FIR filter 200 is (data D(N)×coefficient h(1))+0+0+0+(data D(N−1)×coefficient h(5))+. . . +(data D(1)×coefficient h(4N−3))+0+0+0, and this value becomes the desired filter characteristic in this case.

Further, FIG. 4B shows the relation between the input data and output data of one clock later than the case shown in FIG. 4A. As shown in FIG. 4B, each data in the input data to which zero value interpolation is carried out is shifted for one clock by the delay circuits 60-$n$. Thereafter, in the same way as in FIG. 4A, the shifted data are multiplied by the predetermined coefficients h($n$), respectively, in the multiplication circuits 70-$n$.

For example, as shown in FIG. 4B, the data D(N) is multiplied by the coefficient h(2), the three "0"s inserted between the data D(N) and data D(N−1) are multiplied by the coefficients h(3), h(4) and h(5), respectively, the data D(N−1) is multiplied by the coefficient h(6), or the like.

All of the multiplied results are added in the adding circuit 80, and the added result is outputted from the FIR filter 200. That is, the output data from the FIR filter 200 of one clock later is (data D(N)×coefficient h(2))+0+0+0+(data D(N−1)×coefficient h(6))+. . . +(data D(1)×coefficient h(4N−2))+0+0+0, and this value becomes the desired filter characteristic in this case.

However, when oversampling is carried out to input data, the more the magnification of oversampling increases, the more the number of multiplication circuits required for convolution operation of an FIR filter increases. For example, when fourfold oversampling is carried out, the number of four times as many multiplication circuits as the case not carrying out oversampling is required.

In this case, as shown in FIGS. 4A and 4B, since the multiplied results of the portions of the data to which interpolation is carried out by inserting "0"s are "0"s after all, unnecessary operation is performed. Further, there is a problem that the circuit scale of the FIR filter is increased because of the increase of the number of required multiplication circuits used in the circuit.

SUMMARY OF THE INVENTION

The present invention was made in view of the above-described problems. An object of the present invention is to provide a digital filter whose circuit scale is prevented from increasing even when oversampling is carried out to input data.

Another object of the present invention is to provide a data processing method of such a digital filter.

In order to solve the above-described problems, according to a first aspect of the present invention, a digital filter for extracting a frequency component from a data signal, comprises: a first selection member for selecting one item of data from a plurality of data included in the data signal; a second selection member for selecting one coefficient by which the data selected by the first selection member is multiplied, from a plurality of coefficients; a multiplication member in which data selected by the first selection member is multiplied by the coefficient selected by the second selection member; and an adding member for adding multiplied results from a plurality of multiplication members.

According to a second aspect of the present invention, a data processing method for extracting a frequency component from a data signal, comprises: a first selecting step for selecting one item of data from a plurality of data included in the data signal; a second selecting step for selecting one coefficient by which the data selected in the first selecting step is multiplied, from a plurality of coefficients; a plurality of multiplying steps for multiplying the data selected in the first selecting step by the coefficients selected in the second selecting step; and an adding step for adding multiplied results in a plurality of multiplying steps.

According to the present invention, the data to which multiplication is carried out is selected from a plurality of data included in the data signal, and the coefficient by which the selected data should be multiplied is selected from a plurality of coefficients, are selected. Thereby, although when the data length of a data signal changes, for example, by oversampling, a digital filter can be realized without increasing the number of required multiplication member. Thereby, the circuit scale of the digital filter is prevented from increasing.

Preferably, the data signal may be a data signal in which a "0" is inserted so as to carry out zero value interpolation, and in the first selection member or in the first selecting step, the data other than the inserted "0" may be selected from the plurality of the data. Moreover, the digital data may be an FIR filter.

According to the digital filter, the data other than the inserted "0" can be selected from the plurality of the data included in the data signal to which zero value interpolation is carried out, and the coefficient by which the selected data should be multiplied can be selected from the plurality of the coefficients. Further, the adding member or the adding step can be much more simplified.

According to a third aspect of the present invention, a digital filter comprises: a first selection member for selecting one item of data from a plurality of data inputted into the digital filter; a second selection member for selecting one predetermined coefficient from a plurality of coefficients inputted into the second selection member; and a multiplication member in which the data selected by the first selection member is multiplied by the coefficient selected by the second selection member.

BRIEF DESCRIPTION OF THE DRAWINGS

The present invention will become more fully understood from the detailed description given hereinbelow and the appended drawings which given by way of illustration only, and thus are not intended as a definition of the limits of the present invention, and wherein;

FIG. 3 is a view showing a circuit configuration of an FIR filter in earlier technology;

PREFERRED EMBODIMENT OF THE INVENTION

Referring to the appending drawings, an embodiment according to the present invention will be explained in detail as the following.

Figure 1:
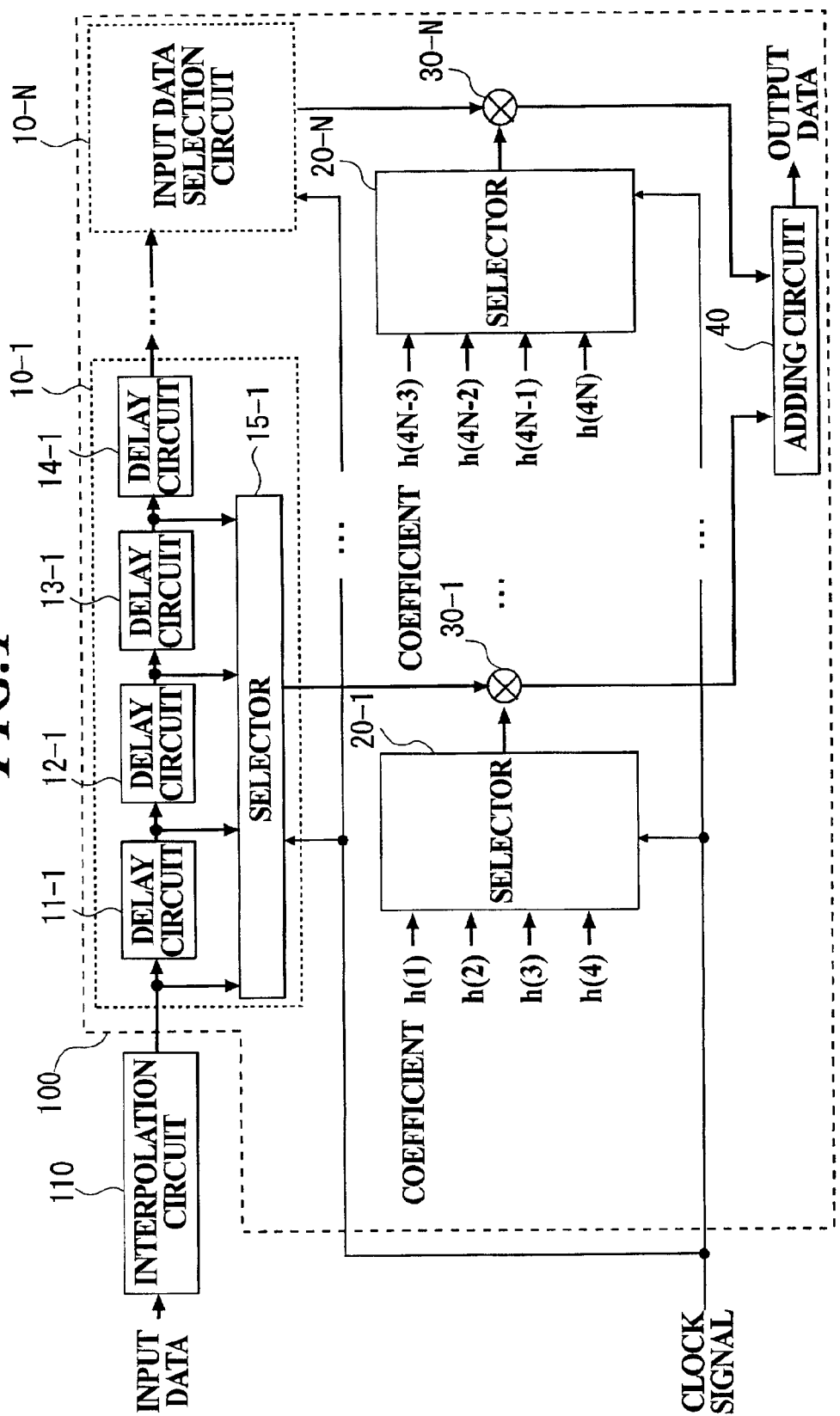
FIG. 1 is a view showing a circuit configuration of an FIR filter according to an embodiment of the present invention.

FIG. 1 is a view showing a circuit configuration of an FIR filter 100 when fourfold oversampling is carried out to the input data. Further, the clock signal in FIG. 1 is a signal for taking synchronism of action of each circuit in the FIR filter 100.

As shown in FIG. 1, zero value interpolation to data length of 4N is carried out to the input data with data length of N in the interpolation circuit 110, and thereafter, the data with data length of 4N is inputted into the FIR filter 100, as the same way as the earlier technology shown in FIG. 3.

The FIR filter 100 comprises N-stages of input data selection circuits 10-$n$ ($n=1,2,3, \ldots ,N$), second selectors 20-$n$ as second selection members and multiplication circuits 30-$n$ as multiplication members which are the same number (N) as the input data selection circuits 10-$n$, and an adding circuit 40 as an adding member. Further, the input data selection circuits 10-$n$ comprise four-stages of delay circuits 11-$n$ to 14-$n$, and first selectors 15-$n$ as first selection members, respectively.

The delay circuits 11-$n$ to 14-$n$ shift the inputted data to which interpolation is carried out, and output the shifted data to the latter stage delay circuits 11-$n$ to 14-$n$ for every timing of the clock signal which is inputted, respectively. For example, the delay circuit 11-1 shifts the inputted data and outputs the shifted data to the delay circuit 12-1, or the like. Further, the shifted data are outputted to the first selectors 15-$n$ at the same time, in parallel.

The first selectors 15-$n$ select one item of data to which multiplication is required to be carried out (that is, the data other than "0"s inserted at the interpolation circuit 110) from each four data inputted from the delay circuits 11-$n$ to 14-$n$, and output the selected data to the multiplication circuits 30-$n$, respectively.

The first selectors 15-$n$ are set to select the data outputted from the delay circuits 11-$n$ as initial values, at first. Then, the first selectors 15-$n$ change the delay circuits for selecting data to one latter stage delay circuits, that is, to the delay circuits 12-$n$, 13-$n$, 14-$n$, and thereafter, to 11-$n$, ..., thus, the stages are selected one by one in order, respectively, for every timing of the clock signal which is inputted. Then, the first selectors 15-$n$ select the data other than "0", and output the selected data to the multiplication circuits 30-$n$, respectively.

Thus, the input data selection circuits 10-$n$ select data D($n$) to which multiplication is required to be carried out, from four data including the three inserted "0"s, and output the data D($n$) to the multiplication circuits 30-$n$.

The second selectors 20-$n$ select one coefficient h(4n−m) (m=0,1,2 or 3) by which each of the data D($n$) is multiplied, from four coefficients h(4n−3) to h(4n), and output the selected coefficients h(4n−m) to the multiplication circuits 30-$n$, respectively. Here, the coefficients h(4n−3), h(4n−2), h(4n−1), and h(4n) are corresponding to the delay circuits 11-*n*, 12-*n*, 13-*n*, and 14-*n*, respectively. For example, when the data D(n) in the delay circuit 11-1 is selected and outputted to the multiplication circuit 30-1 from the first selector 15-1, the coefficient h(1) is selected by the second selector 20-1 and outputted to the multiplication circuit 30-1, or the like.

The second selectors 20-*n* are set to select the coefficients h(4n−3) as initial values, at first. Then, the second selectors 20-*n* change the selecting coefficients h(4n−m) from h(4n−3) to h(4n−2), h(4n−1), h(4n), and thereafter, to h(4n−3), . . . , in order, for every timing of the clock signal which is inputted. Then, when the data D(n) are outputted from the first selectors 15-*n* to the multiplication circuits 30-*n*, the corresponding coefficients h(4n−m) are also outputted from the second selectors 20-*n* to the multiplication circuits 30-*n*, according to the timing of the clock signal.

In the multiplication circuits 30-*n*, the data D(n) inputted from the first selectors 15-*n* of the input data selection circuits 10-*n* are multiplied by the coefficients h(4n−m) inputted from the second selectors 20-*n*, and the multiplied results are outputted to the adding circuit 40.

The adding circuit 40 adds all of the multiplied results inputted from the multiplication circuits 30-*n*, and outputs the added result. The added result by the adding circuit 40 becomes the output data of the FIR filter 100, so that the desired filter characteristic can be obtained.

Thus, the data D(n) to which multiplication is required to be carried out and the coefficients h(4n−m) by which the data D(n) should be multiplied are selected usually by changing selection of the data and coefficients that the first and second selectors 15-*n* and 20-*n* select, for every timing of the clock signal, so that multiplication can be carried out.

Figure 2A:
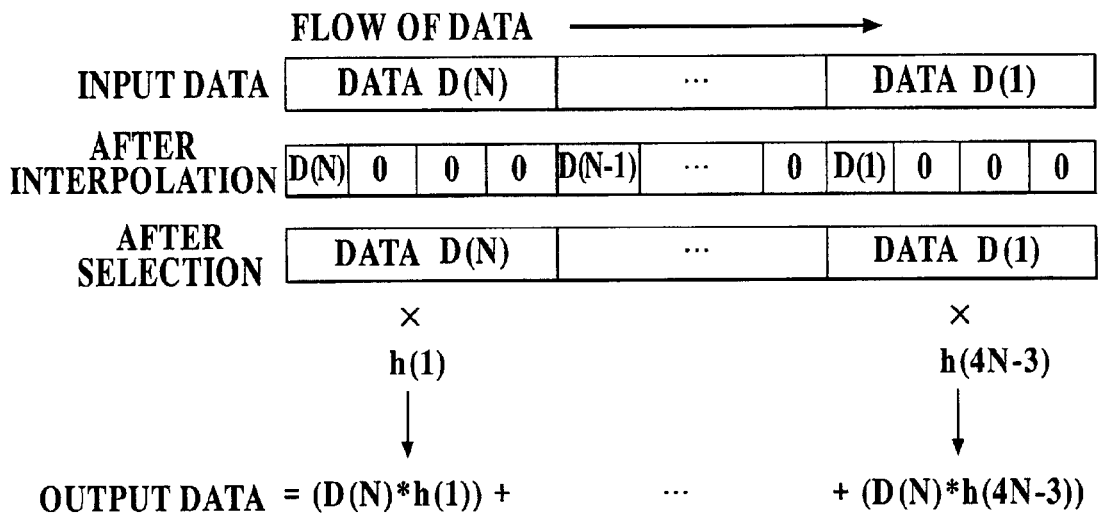
FIG. 2A is a view showing relation between input data and output data in the FIR filter shown in FIG. 1.
Figure 2B:
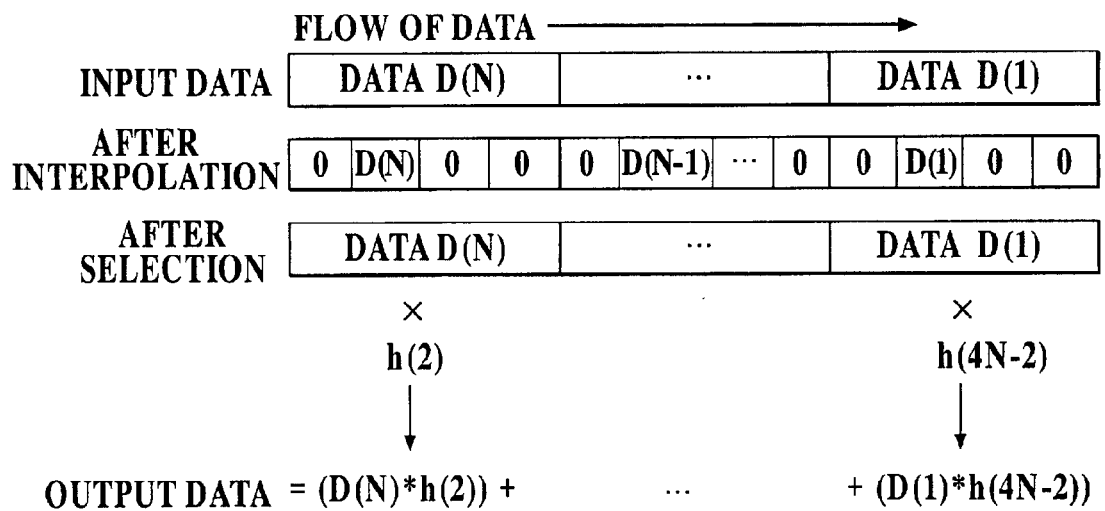
FIG. 2B is a view showing relation between input data and output data in the FIR filter shown in FIG. 1, which is one clock later than FIG. 2A.
Figure 4A:
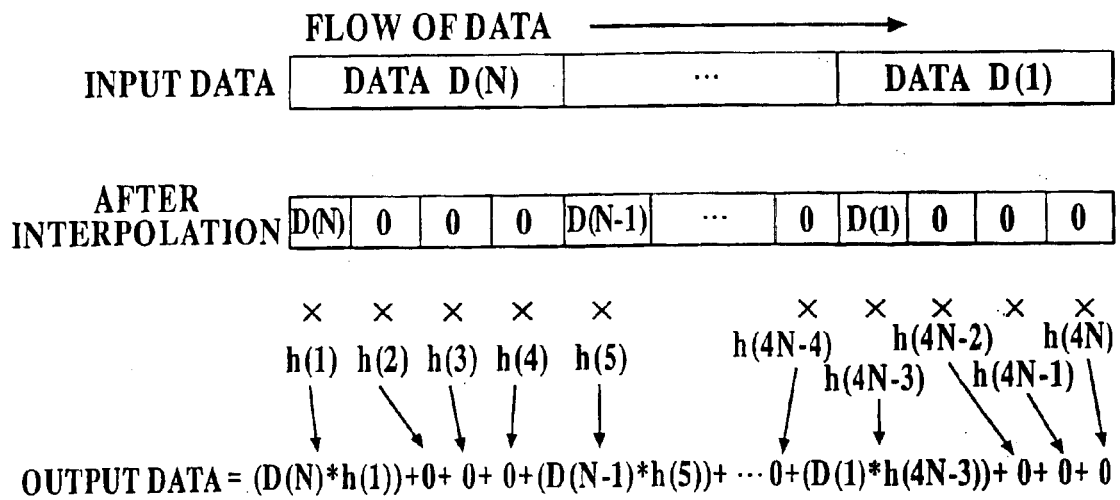
FIG. 4A is a view showing relation between input data and output data in the FIR filter shown in FIG. 3.
Figure 4B:
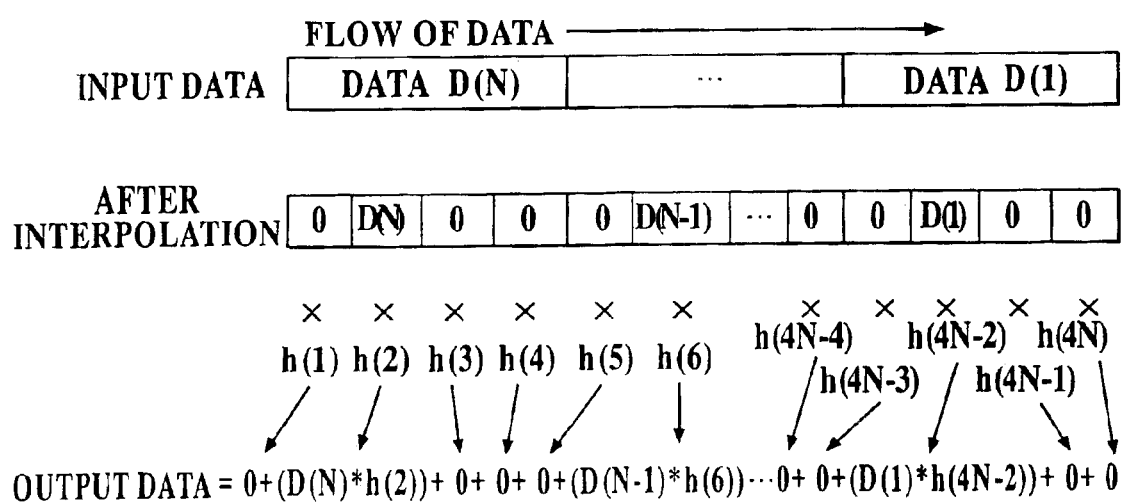
FIG. 4B is a view showing relation between input data and output data in the FIR filter shown in FIG. 3, which is one clock later than FIG. 4A.

FIGS. 2A and 2B show the relation between the input data and the output data (filter characteristic) outputted from the FIR filter 100 in the embodiment according to the present invention. As shown in FIG. 2A, zero value interpolation to data length of 4N is carried out to the input data with data length of N by inserting three "0"s between each adjacent data in the input data with data length of N (that is, three "0"s are inserted after each original data), in the interpolation circuit 110, and the data with data length of 4N is inputted into the FIR filter 100.

Four of the data after interpolation, are made into one group from a head (left end in the figure) at order. The data D(n) to which multiplication is required to be carried out are selected from the groups of data by the first selectors 15-*n*, respectively. Then, the selected data D(n) are outputted to the multiplication circuits 30-*n* and multiplied by the corresponding coefficients h(4n−m) selected by the second selectors 20-*n*.

For example, in FIG. 2A, the data D(N) is multiplied by the coefficient h(1), the data D(N−1) is multiplied by the coefficient h(5), the data D(1) is multiplied by the coefficient h(4N−3), or the like.

All of the multiplied results are added in the adding circuit 40, and the added result is outputted from the FIR filter 100. That is, the output data of the FIR filter 100 is (data D(N)×coefficient h(1))+(data D(N−1)×coefficient h(5)+. . . +(data D(1)×coefficient h(4N−3), and the added value becomes the desired filter characteristic in this case.

Further, FIG. 2B is a view showing the relation between the input data and output data of one clock later than the case shown in FIG. 2A. As shown in FIG. 2B, the input data to which zero value interpolation is carried out are shifted by the delay circuits 11-*n* to 14-*n*. Then, the data D(n) selected by the first selectors 15-*n* are multiplied by the corresponding coefficients h(4n−m) selected by the second selectors 20-*n*, in the multiplication circuits 30-*n*, respectively, in the same way as in FIG. 2A.

For example, in FIG. 2B, the data D(N) is multiplied by the coefficient h(2), the data D(N−1) is multiplied by the coefficient h(6), the data D(1) is multiplied by the coefficient h(4N−2), or the like.

All of the multiplied results are added in the adding circuit 40, and the added result is outputted from the FIR filter 100. That is, the output data of the FIR filter 100 is (data D(N)×coefficient h(2))+(data D(N−1)×coefficient h(6)+. . . +(data D(1)×coefficient h(4N−2), and the added value becomes the desired filter characteristic in this case.

Moreover, although it is not shown in the figure, similarly, when the input data to which zero value interpolation is carried out are shifted by X-clocks of the clock signal, the data D(n) to which multiplication should be carried out and the corresponding coefficients h(4n−m) are selected. Then, the data D(n) are multiplied by the corresponding coefficients h(4n−m), and the multiplied results are added, so that the output data (filter characteristic) can be obtained.

Thus, the data to which multiplication is required to be carried out and the corresponding coefficients are selected in the first and second selectors 15-*n* and 20-*n*, respectively. Thereby, even if the magnification of oversampling changes, an FIR filter circuit can be realized without increasing the number of required multiplication by constituting the FIR filter as described above.

Therefore, an FIR filter which can increase the magnification of oversampling without increasing the hardware scale of the FIR filter, in other words, an FIR filter which is not influenced by the magnification of oversampling, can be realized.

In the above, the embodiment of the present invention is explained. However, it is needless to say that the present invention is not limited to such embodiment, but various modifications are possible in a range within the scope of the present invention.

For example, in the embodiment, the case of FIR filter is explained. However, it may be other digital filters, such as, an IIR (Infinite Impulse Response) filter whose impulse response lasts for infinite time. Further, in the embodiment, the case of fourfold oversampling is explained. However, a digital filter may be realized similarly in the case of arbitrary magnification.

The entire disclosure of Japanese Patent Application No. Tokugan 2000-352944 filed on Nov. 20, 2000 including specification, claims, drawings and summary are incorporated herein by reference in its entirety.

What is claimed is:

1. A digital filter for extracting a frequency component by multiplying a plurality of data constituting a data signal in which at least one "0" is inserted so as to carry out zero value interpolation by a plurality of coefficients, comprising;

a plurality of delay circuits to shift the data signal;

a first selection section to select one data other than the inserted "0" from the plurality of data included in the data signal;

a second selection section to select one coefficient by which the data selected by the first selection section is multiplied, from the plurality of coefficients;

a multiplication section to multiply the data selected by the first selection section by the coefficient selected by the second selection section; and an adding section to add multiplied results obtained by the multiplication section, wherein the first selection section selects one data each time the data signal is shifted, the second selection section selects one coefficient each time the data signal is shifted, and the first selection section selects the one data according to a first predetermined repeating sequence and the second selection section selects the one coefficient according to a second predetermined repeating sequence.

2. The digital filter as claim 1, wherein the digital filter is an FIR filter.

3. The digital filter as claimed in claim 1, wherein a number of steps constituting the first predetermined repeating sequence is equal to a number of the data constituting a repeating unit in the data signal formed by the zero value interpolation.

4. data processing method for extracting a frequency component by multiplying a plurality of data constituting a data signal in which at least one "0" is inserted so as to carry out zero value interpolation by a plurality of coefficients, comprising:

shifting the data signal;

selecting one data other than the inserted "0" from a plurality of data included in the data signal;

selecting one coefficient by which the selected data is multiplied, from a plurality of coefficients;

multiplying the selected one data by the selected one coefficient; and adding multiplied results in the multiplying;

wherein the selecting of one data is carried out with each shifting of the data signal, the selecting of one coefficient is carried out with each shifting of the data signal, and the selecting of the one data is carried out according to a first predetermined repeating sequence and the selecting of the one coefficient is carried out according to a second predetermined repeating sequence.

5. The data processing method as claimed in claim 4, wherein a number of steps constituting the first predetermined repeating sequence is equal to a number of the data constituting a repeating unit in the data signal formed by the zero value interpolation.

* * * * *